US012682976B2

(12) United States Patent
White et al.

(10) Patent No.: US 12,682,976 B2
(45) Date of Patent: Jul. 14, 2026

(54) ERROR DETECTION

(71) Applicant: Arm Limited, Cambridge (GB)

(72) Inventors: Christian Alex White, Burwell (GB);
Alex Beharrell, Cambridge (GB)

(73) Assignee: Arm Limited, Cambridge (GB)

( * ) Notice: Subject to any disclaimer, the term of this
patent is extended or adjusted under 35
U.S.C. 154(b) by 102 days.

(21) Appl. No.: 18/592,740

(22) Filed: Mar. 1, 2024

(65) Prior Publication Data

US 2025/0279149 A1 Sep. 4, 2025

(51) Int. Cl.
*G11C 29/18* (2006.01)

(52) U.S. Cl.
CPC ...... *G11C 29/18* (2013.01); *G11C 2029/1806*
(2013.01)

(58) Field of Classification Search
None
See application file for complete search history.

(56) References Cited

U.S. PATENT DOCUMENTS

| | | | | | |
|---|---|---|---|---|---|
| 5,680,544 | A | * | 10/1997 | Edmondson | G11C 29/34 |
| | | | | | 714/719 |
| 5,793,941 | A | * | 8/1998 | Pencis | G06F 11/22 |
| | | | | | 711/E12.043 |
| 6,161,208 | A | * | 12/2000 | Dutton | G06F 12/0897 |
| | | | | | 714/E11.037 |
| 6,341,094 | B1 | * | 1/2002 | Auracher | G11C 29/56 |
| | | | | | 365/201 |
| 2008/0250271 | A1 | * | 10/2008 | Ozer | G06F 11/0793 |
| | | | | | 712/E9.05 |
| 2009/0006754 | A1 | * | 1/2009 | Luick | G06F 12/1063 |
| | | | | | 711/E12.024 |
| 2013/0039140 | A1 | * | 2/2013 | Roohparvar | G11C 29/16 |
| | | | | | 365/201 |
| 2023/0195574 | A1 | * | 6/2023 | Dhuse | G06F 11/0727 |
| | | | | | 714/764 |

FOREIGN PATENT DOCUMENTS

| | | | | | |
|---|---|---|---|---|---|
| EP | 3493062 | A2 | * | 6/2019 | G06F 11/165 |
| KR | 0121442 | B1 | * | 11/1997 | G06F 11/167 |
| WO | WO-9913404 | A1 | * | 3/1999 | G06F 12/1054 |

* cited by examiner

*Primary Examiner* — Guerrier Merant

(74) *Attorney, Agent, or Firm* — NIXON &
VANDERHYE P.C.

(57) ABSTRACT

A data processing apparatus includes configuration circuitry
that receives, from software, a set of test information and
configures each of a first storage circuit and a second storage
circuit to perform a consistency test based on the test
information. Check circuitry performs the consistency test
between data stored in the first storage circuit and the second
storage circuit and updates result storage circuitry with a
result of the consistency test. The result storage circuitry is
accessible to the software.

17 Claims, 7 Drawing Sheets

20

| | |
|---|---|
| Receive test information | 22 |
| Configure first level and second level | 24 |
| Perform consistency test | 26 |
| Update storage circuitry with result of test | 28 |

ERROR DETECTION

TECHNICAL FIELD

The present disclosure relates to data processing and particularly circuit testing.

DESCRIPTION

Safety critical systems may make use of software test libraries-libraries of tests that are run on live operational hardware in order to help ensure that the hardware is working correctly. Such tests might, for instance, provide particular patterns of inputs to check that the expected outputs are provided and/or that no fault occurs. In some cases, however, it may not be possible to detect that a fault has occurred. For instance, in the case of memory systems, an error in one part of the memory system may result in a 'miss', which causes data to be fetched from another part of the memory system. This fetching may not be possible to detect and hence, the error may go undetected. This is undesirable.

SUMMARY

Viewed from a first example configuration, there is provided a data processing apparatus comprising: configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software.

Viewed from a second example configuration, there is provided a data processing method comprising: receiving, from software, a set of test information; configuring each of a first storage circuit and a second storage circuit to perform a consistency test based on the test information; performing the consistency test between data stored in the first storage circuit and the second storage circuit; and updating result storage circuitry with a result of the consistency test, wherein the result storage circuitry is accessible to the software.

Viewed from a third example configuration, there is provided a non-transitory computer-readable medium to store computer-readable code for fabrication of a data processing apparatus comprising: configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software.

Viewed from a fourth example configuration, there is provided a system comprising: the data processing apparatus, implemented in at least one packaged chip; at least one system component; and a board, wherein the at least one packaged chip and the at least one system component are assembled on the board.

Viewed from a fifth example configuration, there is provided a chip-containing product comprising the system wherein the system is assembled on a further board with at least one other product component.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
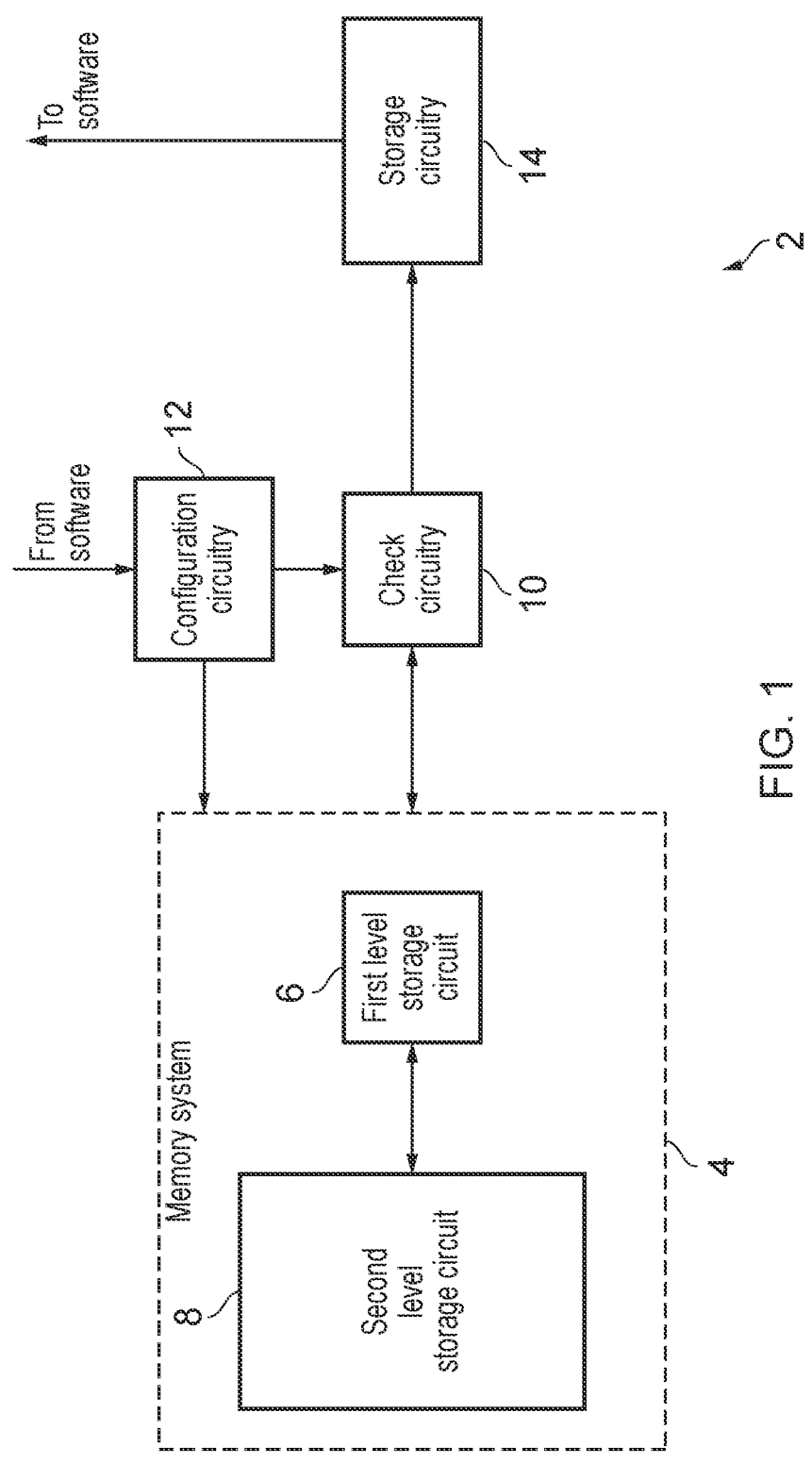
FIG. 1 illustrates an apparatus in accordance with some examples.

Before discussing the embodiments with reference to the accompanying figures, the following description of embodiments is provided.

According to a first example configuration, there is provided a data processing apparatus comprising: configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software.

In accordance with the above, the software issues instructions to the configuration circuitry in order to dictate how the first storage circuit and the second storage circuit should be configured. This might include the loading of specific examples for which tests can be carried out. The check circuitry is then configured to check the consistency of the contents of the first storage circuit against the second storage circuit. The results of the comparison are then written to result storage circuitry that is accessible to the software. In this way it is possible to determine whether either the first storage circuit or the second storage circuit is correctly storing data. By preconfiguring the data stored in one or both of the first storage circuit and second storage circuit, it is possible to perform comparisons against predetermined numbers so that the test does not merely check consistency but checks consistency against predetermined values. In this way it is possible to check the behaviour not only of the first storage circuit but also the second storage circuit. If the values in the first storage circuit and the second storage circuit differ in relation to a predetermined value, it is possible to identify which of the storage circuits is not working correctly. Alternatively, by comparing them to each other, it is possible to tell that one of the storage circuits is not performing correctly. By performing a consistency check between the two circuits, there is no reliance on particular timings. If the circuits differs then one of the circuits is most likely not operating correctly. This helps to alleviate the situation in which an error cannot be detected due to there being no obvious consequence as a result of the error (e.g. where an error would simply result in the data being acquired from elsewhere). Note that the first storage circuit and the second storage circuit need not mean a level one cache and a level two cache, nor do the terms 'first' and 'second' necessarily imply that the two storage circuits are hierarchical to each other or that the 'first' is better, faster, smaller, etc. than the 'second' (or vice-versa). In some examples, the system may be configured in one of these ways, but in other examples, this may not be so. In some examples, the first storage circuitry acts to copy the second storage circuitry, e.g. for redundancy purposes.

In some examples, at least one of the first storage circuit and the second storage circuit is a cache. A cache is usually a small, fast memory structure that is used to store soon-to-be or frequently accessed data so that it can be accessed quickly. In some systems, multiple levels of cache can be provided—with smaller faster caches being accessed first in priority to larger slower caches and ultimately a backing store (e.g. DRAM).

In some examples, at least one of the first storage circuit and the second storage circuit is configured to cache address translations from a first domain to a second domain. In some systems, address translation may be required in order to provide for an expanded memory, memory protection, or to access external devices (e.g. providing data to a graphics card might be achieved by writing data to particular locations in a memory domain that differs from the physical domain). An example of a device that provides such translations is a translation lookaside buffer (TLB) or memory management system (MMS). In these examples, the larger backing store (the second storage circuit) could be another TLB/MMS, or could be a general purpose cache, or could be the DRAM itself.

In some examples, both of the first storage circuit and the second storage circuit are configured to cache address translations from a first domain to a second domain. In these examples, both of the first storage circuit and the second storage circuit are, for instance TLBs/MMSs. A reason for providing such devices is to allow more recently (or more frequently) accessed translations to be accessed more quickly than they would from a larger, slower TLB/MMS. Thus, the frequent or recent translations can be accessed quickly, leading to an overall faster system. In these cases, the smaller TLB/MMS may hold a subset of entries that are stored in the larger TLB/MMS.

In some examples, the first domain is a virtual address domain; and the second domain is a physical address domain. The first domain is a virtual address domain. That is to say that the addresses themselves do not directly refer to anything and indeed may not even indirectly refer to a portion of memory. Instead, the virtual domain can be expanded to refer to the physical domain but also to refer to external devices. In addition, the virtual domain can be used to provide different addresses to a same physical location in the physical memory so that different permissions can be provided for each address. This also allows for complete isolation of a memory system. For instance, entire virtual domains (or contiguous blocks of a single domain) can be allocated to a single process such as an application or operating system. This makes it possible for that application or operating system to see a single view of memory that is only used by that application/operating system. This is in contrast to another scheme in which the address space is shared-thereby potentially enabling one application to see or access the memory used by another application or process. In practice, the actual use to which the virtual domain is used is irrelevant. However, it differs from a physical domain in which the physical addresses correspond to specific locations (e.g. chips or portions of chips) in the physical hardware. Of course, in some other examples, the two domains could be different (or even the same) physical domain. In these cases, 'translation' per say may not occur, but attributes can still be associated with particular addresses so that control can be enforced against particular addresses.

In some examples, the first storage circuit is smaller and faster to retrieve the data than the second storage circuit. The first storage circuit could therefore be a level one cache or a micro translation cache, for instance. Such caches are used to store data that is likely to be requested immediately and are typically both smaller and faster than other caches. Typically a variety or hierarchy of caches of varying sizes and speeds can be used to good effect—e.g. with data that is slightly less likely to be accessed immediately being placed in another bigger/slower cache and only data with the highest likelihood of being accessed being placed in the first storage circuit.

In some examples, the check circuitry comprises comparison circuitry configured to perform a comparison of the data as stored in the first storage circuit and the second storage circuit; and the consistency test is configured to confirm that the data is the same. The consistency test thereby determines consistency by checking that the data in each of the first storage circuit and the data in the second storage circuit is the same. A difference in the data stored in the first storage circuit and the second storage circuit may indicate a fault with the data storage capability—for instance, because a particular bit is variable, or because it readily produces the same value regardless of what is stored.

In some examples, the consistency test is configured to compare the data in the first storage circuit against the second storage circuit. For instance, rather than checking the consistency of both the first storage circuit and the second storage circuit against a third authoritative source, the data stored in the first storage circuit is specifically checked against a version of the supposedly the same data in the second storage circuit to determine whether the two instances of the data match each other.

In some examples, the data comprises an address; and the consistency test is configured to check a consistency of the address. The address could for instance be a physical address or a virtual address. In these examples, the check may be that the addresses themselves are identical rather than simply being equivalent. For instance, in a virtual address space, two different addresses might refer to the same physical address. In general, the addresses would still be considered to be different albeit equivalent.

In some examples, the data comprises one or more attributes; and the consistency test is configured to check a consistency of the one or more attributes. The attributes can be used in order to control permissions or other functions of a particular entry in the memory storage. The attributes can be represented as a series of bits in a separate field of the entry. In the consistency check of these examples, the attributes are checked.

In some examples, the check circuitry is configured to perform the consistency test periodically. For instance, the check circuitry may be performed every period of time, which could be measured by a clock or could be measured by a number of clock cycles or occurrences of another event.

In some examples, the consistency test comprises looking up an entry in the second storage circuit based on first data in the first storage circuit and comparing second data from the first storage circuit to corresponding stored data in the second storage circuit. Note that although the same data should be stored in each of the first storage circuit and the second storage circuit (and thus the term 'the first data' is used), the present technique is intended to detect situations where the same data should be stored, but it is not—e.g. due to circuit failure.

In some examples, the first storage circuit is configured to store the first data in association with the second data such that the second data can be returned in response to queries made in respect of the first data; and the second storage circuit is configured to store the first data in association with the second data such that the second data can be returned in response to queries made in respect of the first data. As above, either of the first storage circuit and the second storage circuit may actually store either of the first data and the second data, but in a corrupted form. The first data and the second data are thus defined in this situation by what the data looked like when it was to be inserted into the first storage circuit or the second storage circuit, respectively.

In some examples, the check circuitry is configured to perform the consistency test for each element of the smallest of the first storage circuit and the second storage circuit. Since the apparatus is looking for consistency, it may be more efficient to iterate through all the entries of the smaller storage circuit rather than the larger one (where entries will exist that are not in the smaller storage circuit and for which no consistency conclusion can be reached).

In some examples, the data processing apparatus comprises a hierarchical memory system comprising the first storage circuit and the second storage circuit. The first storage circuit and the second storage circuit thus form part of the hierarchy, with the first storage circuit and the second storage circuit being of different levels within that hierarchy. For instance, the first storage circuit might be at a first level and the second storage circuit might be at a second level.

Particular embodiments will now be described with reference to the figures.

FIG. 1 illustrates an apparatus 2 in accordance with some examples. A first storage circuit 6 and a second storage circuit 8 are provided. The first storage circuit 6 is considered to be smaller and faster to access than the second storage circuit 8 in these examples. Typically, data that is likely to be accessed more recently is stored in the first storage circuit 6 so that it can be retrieved more quickly. As the data becomes less likely to be accessed, it may be moved to the second storage circuit 8 (or even further). Such data can be accessed, but may be accessed more slowly.

Also in the apparatus 2 is configuration circuitry 12. During normal operation (e.g. periodically), the configuration circuitry 12 may be invoked by software in order to configure testing. In particular, the software indicates the particular tests to be executed and how the memory system 4 should be pre-configured for the testing to take place, e.g. by the insertion of particular values that can be searched for, replaced, and so on. Having performed the configuration, the check circuitry 10 is used to perform the checking as indicated by the software and/or configuration circuitry 12 to determine whether the storage circuits 6, 8 are working correctly. Having performed this testing, the result is then provided to the result storage circuitry 14, which can also be accessed by software in order to determine the result(s) of the testing.

A difficulty that can be encountered is that particular test failures may not be visible. For instance, if a test is being performed in the first storage circuit 6 to determine the presence of data that should be present (e.g. because it was inserted by the configuration circuitry 12) then if the data is not present due to an error, then the data could be fetched from elsewhere such as the second storage circuit 8, and then returned as part of the test. Although it might be possible to infer that the slow response time is indicative of failure, this cannot be guaranteed due to the variance in response times from storage circuits. This is particularly true if the first storage circuit 6 and the second storage circuit 8 are closely related so that retrieval from the second storage circuit 8 is not significantly time consuming.

The present technique seeks to solve this problem by providing the check circuitry 10 with a mechanism to compare the consistency of the first storage circuit 6 against the second storage circuit 8. In this way, the storage circuits 6, 8 merely being able to return the data is insufficient, yet errors that might occur in one of the storage circuits 6, 8 can still be detected.

Note that in this example, the first storage circuit 6 and the second storage circuit 8 form part of a same memory system 4. However, this need not be the case.

Figure 2:
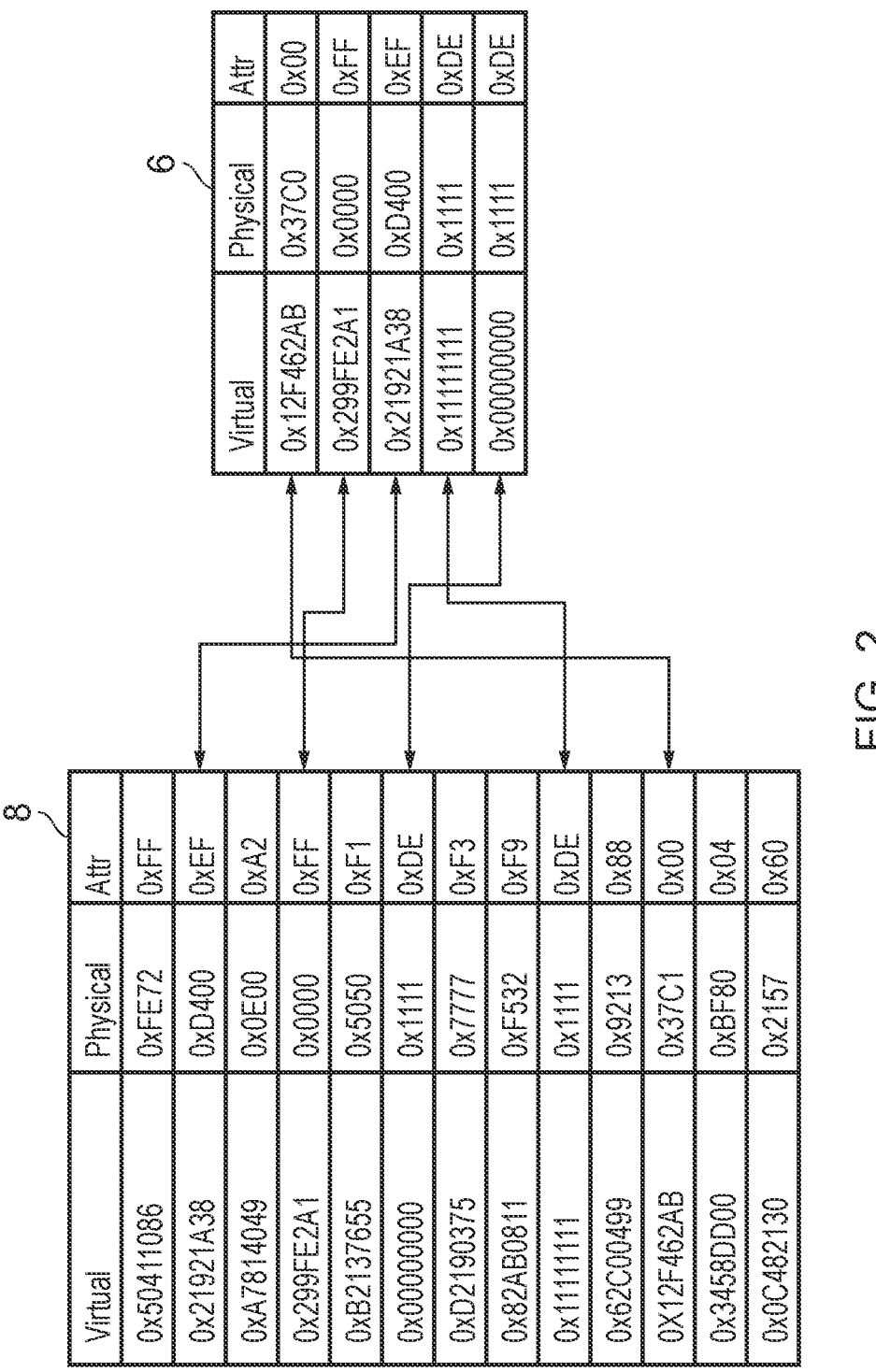
FIG. 2 illustrates an example of the consistency checking that might occur between the first storage circuit and the second storage circuit.

FIG. 2 illustrates an example of the consistency checking that might occur between the first storage circuit 6 and the second storage circuit 8. In this example, the first storage circuit 6 and the second storage circuit 8 both take the form of translation circuits that provide translations from virtual addresses to physical addresses. Each translation may also have one or more attributes that indicate, for instance, permissions or other parameters that relate to the translation.

In this example, the process iterates through the first storage circuit 6 and for each entry, requests the corresponding entry from the second storage circuit 8 (as well as the associated attributes). The entries are then compared and the results are written to the result storage circuitry 14.

For example, in a first check, the virtual address 0x12F462AB is used to request a physical address from the second storage circuit 8. The second storage circuit returns a physical address of 0x37C1. This is compared against the corresponding physical address and attributes stored in the first storage circuit 6 for the address 0x12F462AB. In this case, there is not a match because the physical address 0x37C1 returned by the second storage circuit 8 differs from the physical address 0x37C0 returns by the first storage circuit 6. The test therefore fails.

In some examples, the comparison considers the attributes. In the above example, the attributes returned by both the second storage circuit 8 and the first storage circuit 6 are the same—0x00. Consequently the comparison passes. In some examples, both the returned address and the attributes are compared and if either comparison fail then the overall consistency check fails.

A contrasting example where the comparison passes is when the virtual address 0x21921A38 is considered. Here, both the physical address returned by the second storage circuit 8 and the first storage circuit 6 (0xD400) and the attributes returned by the second storage circuit 8 and the first storage circuit 6 (0xEF) match and so the overall match passes.

In this example, if there is a lack of consistency in any entry of the first storage circuit 6 then the overall test fails, otherwise the test succeeds. The data that is written to the result storage circuitry 14 may be as simple as indicating that the test failed, or may provide more detail such as which entry failed, what the returned values were and so on. Of course, none of this data necessarily indicates, in isolation, whether the second storage circuit 8 or the first storage circuit 6 was at fault. Further testing may be required in order to infer this information. The level of information provided may be a factor that is controlled by the configuration circuitry 12.

Figure 3:
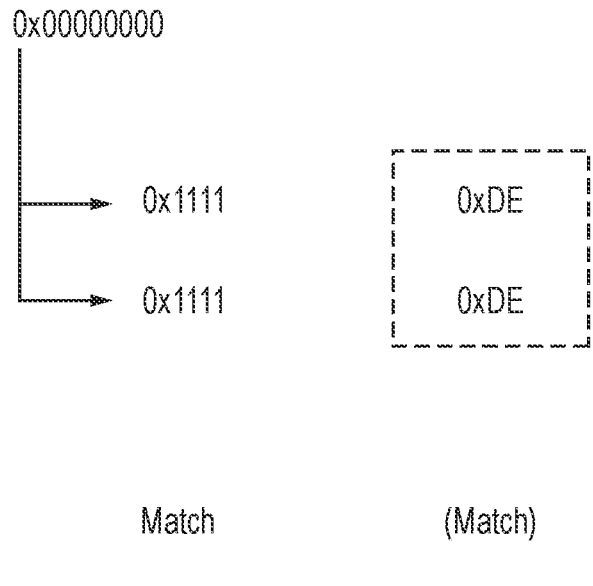
FIG. 3 shows an example of the comparison that may occur.

FIG. 3 shows an example of the comparison that may occur. In this case, the virtual address 0x00000000 is provided to obtain physical addresses 0x1111 and 0x1111 from each of the first storage circuit 6 and second storage circuit 8. In addition, the attributes 0xDE and 0xDE are provided for each of the first storage circuit 6 and second storage circuit 8. Each of these is compared, e.g. in a bitwise manner, and since the values are considered to be identical, the test passes.

Note that, as indicated in FIG. 3, the comparison of the attributes is optional but if performed, required a similar identity between the values provided by each of the first storage circuit 6 and the second storage circuit 8.

This test may fail if, for instance, the storage of the physical address 0x1111 was supposed to be in relation to virtual address 0x00000000 but was actually stored against virtual address 0x00000001 due to a stuck-at-one error in relation to the least significant bit.

Figure 4:
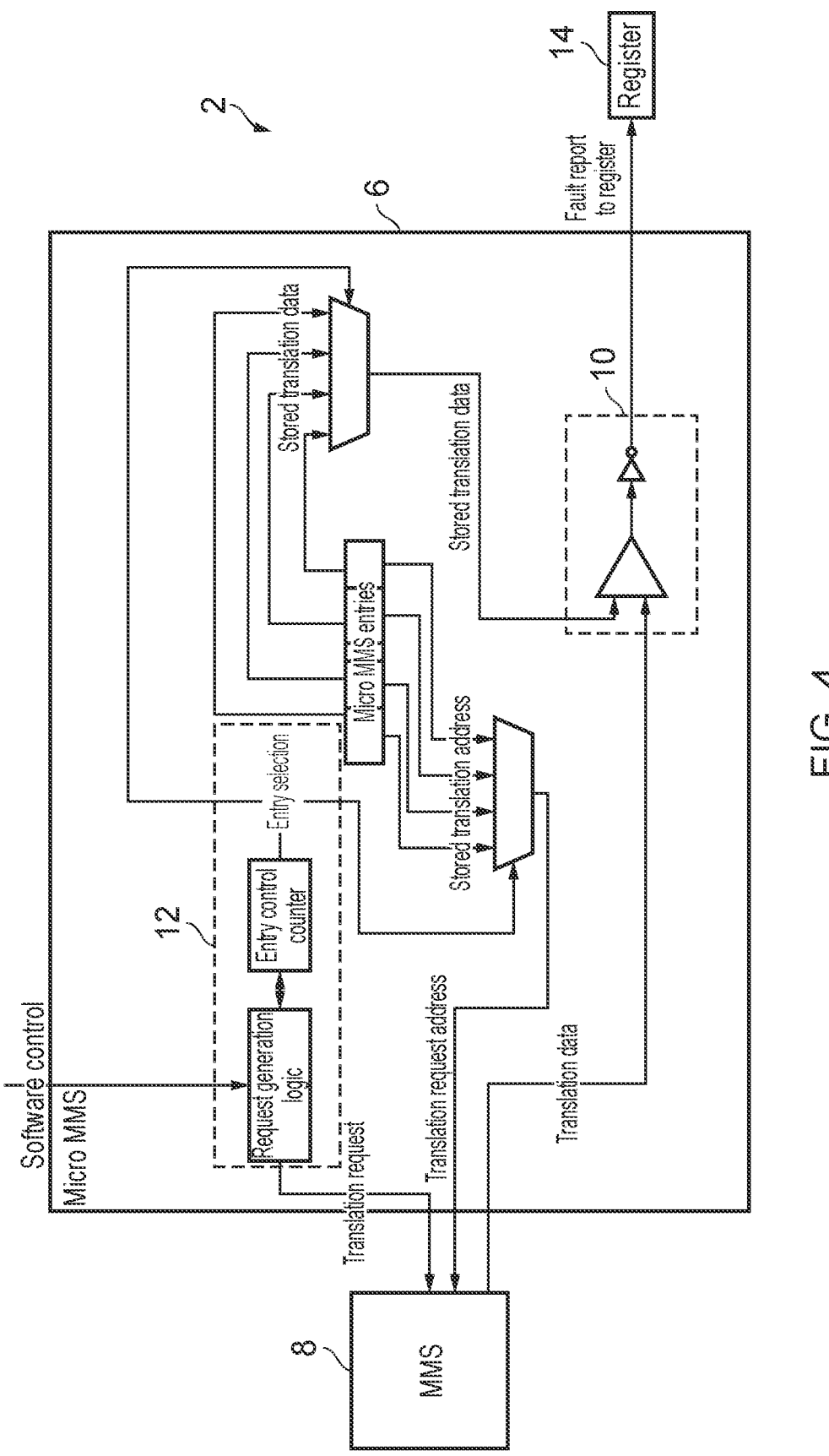
FIG. 4 shows an example of the apparatus illustrated in a digital circuit diagram.

FIG. 4 shows an example of the apparatus 2 illustrated in a digital circuit diagram. In this example, the first storage circuitry 6 takes the form of a micro MMS (memory management system) and the second storage circuitry takes the form of a MMS 8 (memory management system). The two circuits 6, 8 can therefore be thought of as being hierarchical in this example, with the first storage circuit 6 at one level of the hierarchy and the second storage circuit 8 at another level of the hierarchy. Note that the size of the various circuits 6, 8 in FIG. 4 are not representative of their actual sizes. The MMS 8 and the micro MMS 6 both store translations from a first address domain (the virtual domain) to a second address domain (the physical domain), with the micro MMS 6 storing a subset of the translations stored in the MMS 8.

In this example, a software test library (STL) provides test instructions to the configuration circuitry 12. This sets up any required values in the micro MMS 6 and MMS 8 and then iterates through entries the micro MMS 6 using an entry counter. At each step, this generates an entry selection signal, which is used to select (using multiplexers) the stored translation data (e.g. the physical address and/or attributes) and stored translation address (the virtual address) for a particular entry of the micro MMS. A translation request is then issued to the MMS 8 using the stored translation address (e.g. the virtual address). This returns translation data (e.g. the physical address and/or attributes), which are compared to the stored translation data using comparison circuitry 10. The result of each comparison is then written to a register 14, which is accessible to the software. The iteration can occur for each entry in the micro MMS 6, which is expected to be the smaller of the micro MMS 6 and MMS 8.

In terms of the tests that are performed, it can be desirable for the configuration to test addresses and attributes that are all 0s and all 1s. This is to help the detection of 'stuck at 0' and 'stuck at 1' errors in which the circuitry is unable to store anything other than a 0 or a 1. By explicitly trying to set the addresses (and the attributes) to all 0s and then to all 1s, such a circuitry error can be detected.

Figure 5:
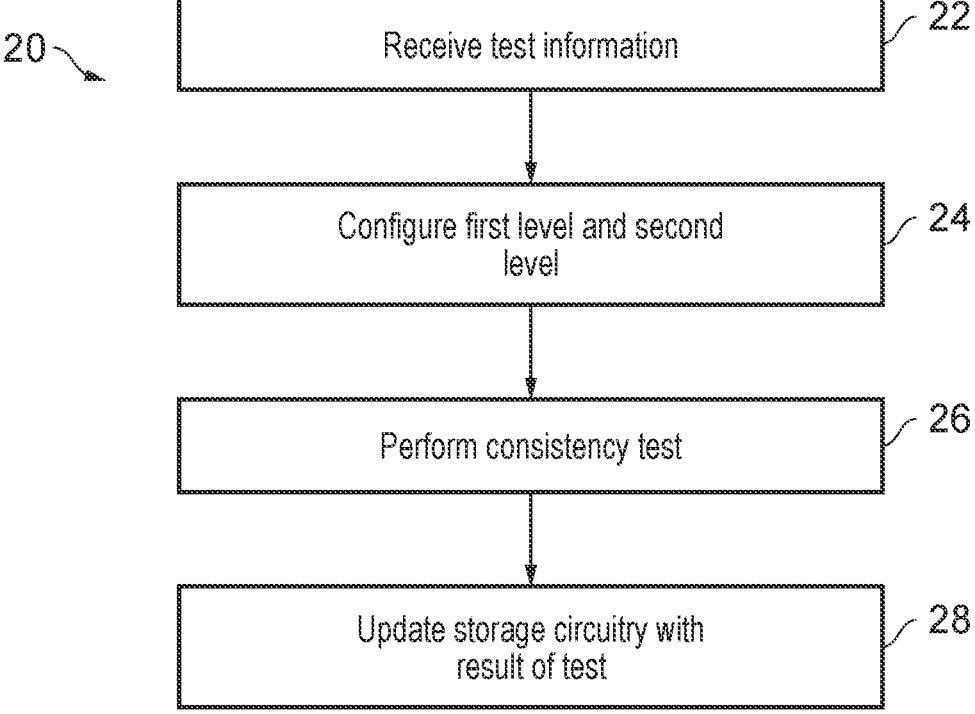
FIG. 5 shows a flowchart that shows a method of data processing in accordance with some examples.

FIG. 5 shows a flowchart 20 that shows a method of data processing in accordance with some examples. At a step 22, test information is acquired (e.g. from the STL). At a step 24, the first storage circuit 6 and the second storage circuit 8 are configured with appropriate data for testing. Then at step 26, the consistency test is performed. Finally at step 28 the result storage circuitry 14 is updated with a result of the test. Note that step 28 may be performed after each iteration of the test, or the data can be buffered and written to the register 14 as a final step.

Figure 6:
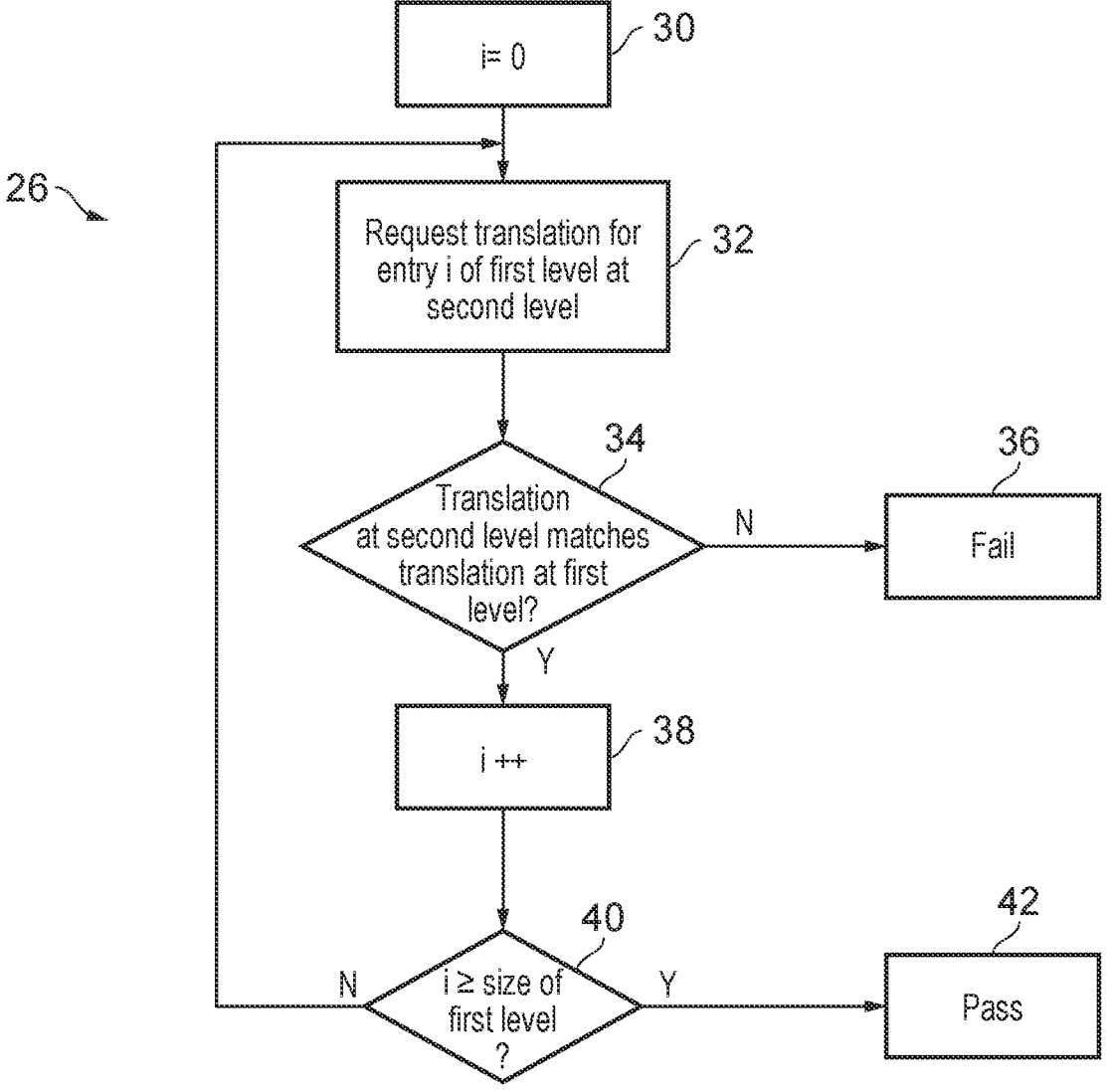
FIG. 6 illustrates the checking step in more detail.

FIG. 6 illustrates step 26 in more detail. At a step 30, an iterator index i is set to 0. Then at step 32, the translation and attributes for entry i of the first storage circuitry 6 is sought from the second storage circuitry 8. At step 34, these are compared to the corresponding values in the first storage circuitry 6. If these differ then the test fails at step 36. Otherwise, at step 38, the iterator index i is incremented and then at step 40 the iterator index i is compared to the size of the first storage circuitry 6. If the iterator index is the same or equal (i.e. if all entries have been iterated through) then at step 42 the test is passed. Otherwise, the process returns to step 32 to begin the next comparison.

Again, in this example, it is assumed that the result of the test is written at the end of the testing rather than at each iteration. Furthermore, in this example, the test is fast-fail meaning that if the test fails then the testing process ends immediately. This need not be the case and in other examples (particularly when details of the entire test are written), the failure permits the test to continue with the next entry.

Accordingly, the above technique makes it possible to check a correct behaviour of the first storage circuit 6. This can be achieved using a single test, which reduces the complexity and size of the SDL used to perform the testing. The testing does not rely on any kind of timing detection and so can be used for storage circuitry in which an error or fault that occurs may not be detectable due to data simply being fetched from elsewhere.

Concepts described herein may be embodied in a system comprising at least one packaged chip. The apparatus described earlier is implemented in the at least one packaged chip (either being implemented in one specific chip of the system, or distributed over more than one packaged chip). The at least one packaged chip is assembled on a board with at least one system component. A chip-containing product may comprise the system assembled on a further board with at least one other product component. The system or the chip-containing product may be assembled into a housing or onto a structural support (such as a frame or blade).

Figure 7:
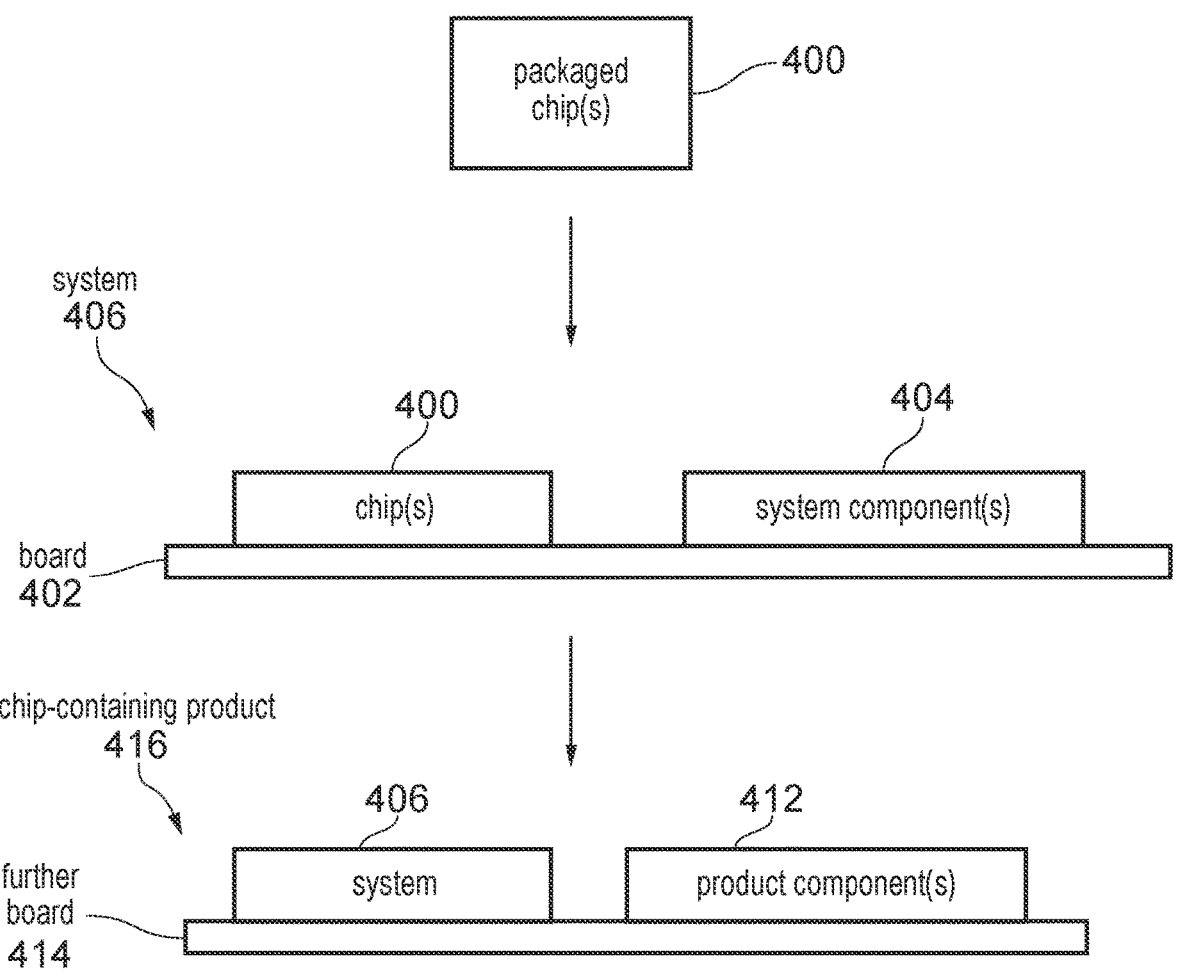
FIG. 7 shows an example using one or more packaged chips.

As shown in FIG. 7, one or more packaged chips 400, with the apparatus described above implemented on one chip or distributed over two or more of the chips, are manufactured by a semiconductor chip manufacturer. In some examples, the chip product 400 made by the semiconductor chip manufacturer may be provided as a semiconductor package which comprises a protective casing (e.g. made of metal, plastic, glass or ceramic) containing the semiconductor devices implementing the apparatus described above and connectors, such as lands, balls or pins, for connecting the semiconductor devices to an external environment. Where more than one chip 400 is provided, these could be provided as separate integrated circuits (provided as separate packages), or could be packaged by the semiconductor provider into a multi-chip semiconductor package (e.g. using an interposer, or by using three-dimensional integration to provide a multi-layer chip product comprising two or more vertically stacked integrated circuit layers).

In some examples, a collection of chiplets (i.e. small modular chips with particular functionality) may itself be referred to as a chip. A chiplet may be packaged individually in a semiconductor package and/or together with other chiplets into a multi-chiplet semiconductor package (e.g.

using an interposer, or by using three-dimensional integration to provide a multi-layer chiplet product comprising two or more vertically stacked integrated circuit layers).

The one or more packaged chips 400 are assembled on a board 402 together with at least one system component 404 to provide a system 406. For example, the board may comprise a printed circuit board. The board substrate may be made of any of a variety of materials, e.g. plastic, glass, ceramic, or a flexible substrate material such as paper, plastic or textile material. The at least one system component 404 comprise one or more external components which are not part of the one or more packaged chip(s) 400. For example, the at least one system component 404 could include, for example, any one or more of the following: another packaged chip (e.g. provided by a different manufacturer or produced on a different process node), an interface module, a resistor, a capacitor, an inductor, a transformer, a diode, a transistor and/or a sensor.

A chip-containing product 416 is manufactured comprising the system 406 (including the board 402, the one or more chips 400 and the at least one system component 404) and one or more product components 412. The product components 412 comprise one or more further components which are not part of the system 406. As a non-exhaustive list of examples, the one or more product components 412 could include a user input/output device such as a keypad, touch screen, microphone, loudspeaker, display screen, haptic device, etc.; a wireless communication transmitter/receiver; a sensor; an actuator for actuating mechanical motion; a thermal control device; a further packaged chip; an interface module; a resistor; a capacitor; an inductor; a transformer; a diode; and/or a transistor. The system 406 and one or more product components 412 may be assembled on to a further board 414.

The board 402 or the further board 414 may be provided on or within a device housing or other structural support (e.g. a frame or blade) to provide a product which can be handled by a user and/or is intended for operational use by a person or company. The system 406 or the chip-containing product 416 may be at least one of: an end-user product, a machine, a medical device, a computing or telecommunications infrastructure product, or an automation control system. For example, as a non-exhaustive list of examples, the chip-containing product could be any of the following: a telecommunications device, a mobile phone, a tablet, a laptop, a computer, a server (e.g. a rack server or blade server), an infrastructure device, networking equipment, a vehicle or other automotive product, industrial machinery, consumer device, smart card, credit card, smart glasses, avionics device, robotics device, camera, television, smart television, DVD players, set top box, wearable device, domestic appliance, smart meter, medical device, heating/lighting control device, sensor, and/or a control system for controlling public infrastructure equipment such as smart motorway or traffic lights.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, System Verilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

The apparatus may be configured as follows:

1. A data processing apparatus comprising:

configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software.

2. The data processing apparatus according to clause 1, wherein at least one of the first storage circuit and the second storage circuit is a cache.

3. The data processing apparatus according to any preceding clause, wherein at least one of the first storage circuit and the second storage circuit is configured to cache address translations from a first domain to a second domain.

4. The data processing apparatus according to any preceding clause, wherein both of the first storage circuit and the second storage circuit are configured to cache address translations from a first domain to a second domain.

5. The data processing apparatus according to any one of clauses 3-4, wherein the first domain is a virtual address domain; and the second domain is a physical address domain.

6. The data processing apparatus according to any preceding clause, wherein the first storage circuit is smaller and faster to retrieve the data than the second storage circuit.

7. The data processing apparatus according to any preceding clause, wherein the check circuitry comprises comparison circuitry configured to perform a comparison of the data as stored in the first storage circuit and the second storage circuit; and the consistency test is configured to confirm that the data is the same.

8. The data processing apparatus according to clause 7, wherein the consistency test is configured to compare the data in the first storage circuit against the second storage circuit.

9. The data processing apparatus according to any preceding clause, wherein the data comprises an address; and the consistency test is configured to check a consistency of the address.

10. The data processing apparatus according to any preceding clause, wherein the data comprises one or more attributes; and the consistency test is configured to check a consistency of the one or more attributes.

11. The data processing apparatus according to any preceding clause, wherein the check circuitry is configured to perform the consistency test periodically.

12. The data processing apparatus according to any preceding clause, wherein the consistency test comprises looking up an entry in the second storage circuit based on first data in the first storage circuit and comparing second data from the first storage circuit to corresponding stored data in the second storage circuit.

13. The data processing apparatus according to clause 12, wherein the first storage circuit is configured to store the first data in association with the second data such that the second data can be returned in response to queries made in respect of the first data; and the second storage circuit is configured to store the first data in association with the second data such that the second data can be returned in response to queries made in respect of the first data.

14. The data processing apparatus according to any preceding clause, wherein the check circuitry is configured to perform the consistency test for each element of the smallest of the first storage circuit and the second storage circuit.

15. The data processing apparatus according to any preceding clause, comprising:

a hierarchical memory system comprising the first storage circuit and the second storage circuit.

16. A data processing method comprising:

receiving, from software, a set of test information;

configuring each of a first storage circuit and a second storage circuit to perform a consistency test based on the test information;

performing the consistency test between data stored in the first storage circuit and the second storage circuit; and updating result storage circuitry with a result of the consistency test, wherein the result storage circuitry is accessible to the software.

17. A non-transitory computer-readable medium to store computer-readable code for fabrication of a data processing apparatus comprising:

configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software.

18. A system comprising:

the data processing apparatus according to any one of clauses 1-15, implemented in at least one packaged chip;

at least one system component; and a board, wherein the at least one packaged chip and the at least one system component are assembled on the board.

19. A chip-containing product comprising the system of clause 18 wherein the system is assembled on a further board with at least one other product component.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A data processing apparatus comprising:

configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software;

the consistency test comprises looking up an entry in the second storage circuit based on first data in the first storage circuit and comparing second data from the first storage circuit to corresponding stored data in the second storage circuit;

the first storage circuit is configured to store the first data in association with the second data such that the second data can be returned in response to queries made in respect of the first data; and the second storage circuit is configured to store the first data in association with the second data such that the second data can be returned in response to queries made in respect of the first data.

2. The data processing apparatus according to claim 1, wherein at least one of the first storage circuit and the second storage circuit is a cache.

3. The data processing apparatus according to claim 1, wherein at least one of the first storage circuit and the second storage circuit is configured to cache address translations from a first domain to a second domain.

4. The data processing apparatus according to claim 3, wherein the first domain is a virtual address domain; and the second domain is a physical address domain.

5. The data processing apparatus according to claim 1, wherein both of the first storage circuit and the second storage circuit are configured to cache address translations from a first domain to a second domain.

6. The data processing apparatus according to claim 1, wherein the first storage circuit is smaller and faster to retrieve the data than the second storage circuit.

7. The data processing apparatus according to claim 1, wherein the check circuitry comprises comparison circuitry configured to perform a comparison of the data as stored in the first storage circuit and the second storage circuit; and the consistency test is configured to confirm that the data is the same.

8. The data processing apparatus according to claim 7, wherein the consistency test is configured to compare the data in the first storage circuit against the second storage circuit.

9. The data processing apparatus according to claim 1, wherein the data comprises an address; and the consistency test is configured to check a consistency of the address.

10. The data processing apparatus according to claim 1, wherein the data comprises one or more attributes; and the consistency test is configured to check a consistency of the one or more attributes.

11. The data processing apparatus according to claim 1, wherein the check circuitry is configured to perform the consistency test periodically.

12. The data processing apparatus according to claim 1, wherein the check circuitry is configured to perform the consistency test for each element of the smallest of the first storage circuit and the second storage circuit.

13. The data processing apparatus according to claim 1, comprising:

a hierarchical memory system comprising the first storage circuit and the second storage circuit.

14. A system comprising:

the data processing apparatus according to claim 1, implemented in at least one packaged chip;

at least one system component; and a board, wherein the at least one packaged chip and the at least one system component are assembled on the board.

15. A chip-containing product comprising the system of claim 14 wherein the system is assembled on a further board with at least one other product component.

16. A data processing method comprising:

receiving, from software, a set of test information;

configuring each of a first storage circuit and a second storage circuit to perform a consistency test based on the test information;

performing the consistency test between data stored in the first storage circuit and the second storage circuit; and updating result storage circuitry with a result of the consistency test, wherein the result storage circuitry is accessible to the software;

the consistency test comprises looking up an entry in the second storage circuit based on first data in the first storage circuit and comparing second data from the first storage circuit to corresponding stored data in the second storage circuit;

the first storage circuit stores the first data in association with the second data such that the second data can be returned in response to queries made in respect of the first data; and the second storage circuit stores the first data in association with the second data such that the second data can be returned in response to queries made in respect of the first data.

17. A non-transitory computer-readable medium to store computer-readable code for fabrication of a data processing apparatus comprising:

configuration circuitry configured to receive, from software, a set of test information and to configure each of a first storage circuit and a second storage circuit to perform a consistency test based on the test information; and check circuitry configured to perform the consistency test between data stored in the first storage circuit and the second storage circuit and to update result storage circuitry with a result of the consistency test, wherein the result storage circuitry is accessible to the software;

the consistency test comprises looking up an entry in the second storage circuit based on first data in the first storage circuit and comparing second data from the first storage circuit to corresponding stored data in the second storage circuit;

the first storage circuit is configured to store the first data in association with the second data such that the second data can be returned in response to queries made in respect of the first data; and the second storage circuit is configured to store the first data in association with the second data such that the second data can be returned in response to queries made in respect of the first data.

* * * * *